United States Patent [19]
März et al.

[11] Patent Number: 6,007,960
[45] Date of Patent: Dec. 28, 1999

[54] PROCESS FOR PRODUCING A COLORED IMAGE WITH REDUCED DOT GAIN AND COLORED IMAGE OBTAINED THEREBY

[75] Inventors: Karin März, Mainz; Dieter Mohr, Appenheim; Dieter Bodenheimer, Aarbergen; Manfred Hilger, Konz, all of Germany

[73] Assignee: Agfa-Gevaert, Mortsel, Belgium

[21] Appl. No.: 08/842,791

[22] Filed: Apr. 16, 1997

Related U.S. Application Data

[60] Provisional application No. 60/021,502, Jul. 10, 1996.

[30] Foreign Application Priority Data

Apr. 23, 1996 [EP] European Pat. Off. .............. 96201079

[51] Int. Cl.$^6$ ................................. G03F 7/34; G03C 5/60

[52] U.S. Cl. .......................... 430/143; 430/152; 430/253; 430/254; 430/257; 430/293

[58] Field of Search ..................................... 430/143, 152, 430/253, 254, 257, 293

[56] References Cited

U.S. PATENT DOCUMENTS

| | | | |
|---|---|---|---|
| 4,093,463 | 6/1978 | Fletcher et al. | 430/152 |
| 4,334,006 | 6/1982 | Kitajima et al. | 430/143 |
| 4,818,663 | 4/1989 | Powers et al. | 430/358 |
| 4,977,070 | 12/1990 | Winslow | 430/152 |

*Primary Examiner*—John S. Chu
*Attorney, Agent, or Firm*—Foley & Lardner

[57] ABSTRACT

A process for producing a colored image by laminating a light-sensitive material comprising a temporary support film (i), a colored light-sensitive layer and a heat-activable adhesive layer onto an image-receiving material at elevated temperature and under pressure, subjecting the light-sensitive layer to imagewise exposure and developing by peeling off the support film, characterized in that the image-receiving material comprises a light-sensitive compound which, on irradiation, releases a gas which remains trapped in the image-receiving material in the form of gas bubbles. The advantage of the process is that, on irradiation under a halftone original, the size of the halftone dots in the coloured image produced on such an image-receiving material is optically reduced.

8 Claims, 1 Drawing Sheet

FIG. 1

Construction of the image support of the invention and of the 1st colour-proofing film F before lamination

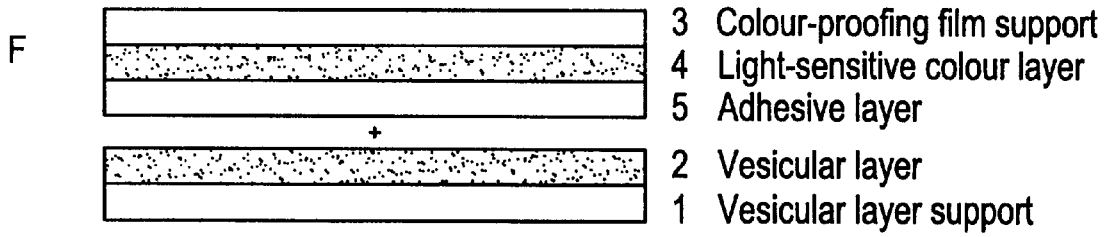

F

3 Colour-proofing film support
4 Light-sensitive colour layer
5 Adhesive layer

2 Vesicular layer
1 Vesicular layer support

FIG. 2

Construction of coloured image of the invention following lamination of the 1st primary colour

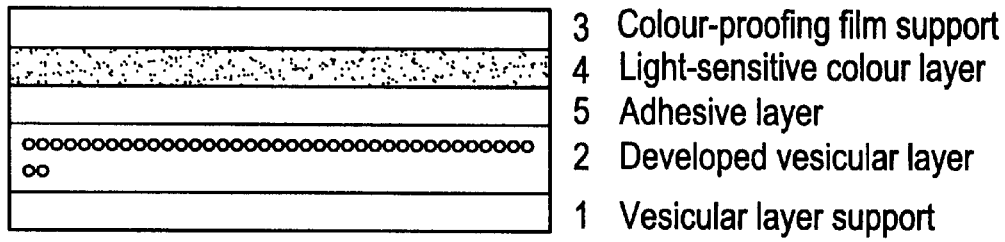

3 Colour-proofing film support
4 Light-sensitive colour layer
5 Adhesive layer
2 Developed vesicular layer
1 Vesicular layer support

FIG. 3

Construction of coloured image of the invention after development of 1st primary colour image

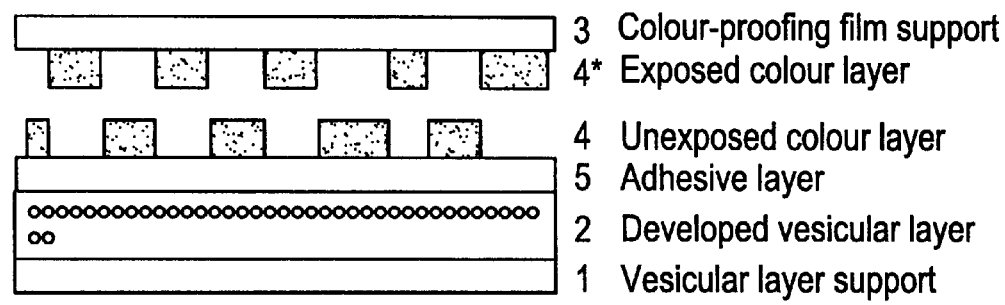

3 Colour-proofing film support
4* Exposed colour layer
4 Unexposed colour layer
5 Adhesive layer
2 Developed vesicular layer
1 Vesicular layer support

PROCESS FOR PRODUCING A COLORED IMAGE WITH REDUCED DOT GAIN AND COLORED IMAGE OBTAINED THEREBY

This application claims the benefit of U.S. Provisional Application Ser. No. 60/021,502 filed Jul. 10, 1996.

DESCRIPTION

The invention relates to a process for producing a coloured image for the colour proofing of originals for multicolour printing, a layer material to carry it out, and a coloured image obtained thereby.

Such a coloured image is generally produced to assist a printer in checking and, if necessary, correcting the colour separations which will be used in exposing the printing plates in multicolour printing. This colour-proofing image has to be a consistent duplicate of the desired halftone or line image. The proof should reproduce the tonal values of the colours naturally and identically with the later printed image.

In the production of such a colour-proofing image it is customary to produce successive primary colour images corresponding to the primary colours of the multicolour print on an image-receiving material or transfer them thereto.

Each primary colour image is produced by exposing and developing a light-sensitive layer, the method of development employed being either washing off or peeling off a support film.

Numerous materials and processes for producing such colour-proofing images are known and described for example in the following documents: U.S. Pat. No. 3,649, 268, U.S. Pat. No. 3,642,474, U.S. Pat. No. 4,260,673, U.S. Pat. No. 4,650,738, U.S. Pat. No. 4,656,114, U.S. Pat. No. 4,659,642, U.S. Pat. No. 4,895,787, U.S. Pat. No. 5,049,476, EP-A 447829. In order that, in a colour-proofing process, the tonal values of the colours visually conform to those in the later printed image, the colour-proofing process must allow simulation of the dot gain in printing. Dot gain is the enlargement of the halftone dot in printing compared with the film original. There is physical (or mechanical) dot gain and optical dot gain, depending on the cause. Physical dot gain is an actually measurable enlargement of the halftone dot during the printing process, which depends on various parameters, for example the nature of the printing paper, the nature of the printing ink, the nature of the press and also the nature of the printing plates, etc. Optical dot gain, by contrast, has its cause in light scattering and absorption properties (shadow effect). The actual dot size does not change. Optical dot gain depends on the texture and opacity of the paper and in the case of the colour-proofing image additionally on any adhesive and release layers present. In offset printing dot gain is depending on the parameters mentioned about 8–30% in the mid tones, i.e. at about 40–50% coverage of the halftone. Low dot gains are preferred for high quality prints because of the higher sharpness of image.

The colour-proofing image production materials described in the cited references consist of a plurality of layers on temporary support films. Colourless release and/or adhesive layers are the cause in the ready-produced colour-proofing image of an optical dot gain which generally amounts to about 20–25%. Within certain limits, the dot gain in the colour-proofing image can be controlled by the thickness of the adhesive or release layers, as described for example in U.S. Pat. No. 4,262,071 and EP-A 339860. The possibility of reducing dot gain by means of thin adhesive layers, however, is restricted by processing difficulties, which necessitate an increase in the lamination temperature or a reduction in the lamination speed. A further possible way of reducing dot gain is to add white pigments, for example titanium dioxide, to the adhesive layer of the colour films or to the image-receiving material. If the titanium dioxide is added to the adhesive layer of the colour films, only the colour film for the first primary colour image can in each case be provided with such a $TiO_2$-containing adhesive layer, since, in the following layers, the white pigment would affect the colour. Hence the sequence of colours in the construction of the image is disadvantageously predetermined and, what is more, only a small reduction in the dot gain is achieved. Such a material is described in EP-A 420675.

Preference is given to processes where dot gain can be controlled without changing the colour film material, for example by adding $TiO_2$ to the image-receiving material, described in EP-A 305599 and EP-A 625224, for example. Instead of titanium dioxide it is also possible to use barium sulphate, calcium carbonate or titania-containing pearl lustre pigments described in EP-A 186902. The white pigment may also be applied to the image-receiving material as an additional primer layer, described in EP-A 639736. To ensure adequate adhesion to the receiving sheet, the primer layer has in this instance to be constructed of two layers—an adhesive layer and a layer containing the white pigment.

As a further way of reducing dot gain by means of a specific image-receiving material the literature mentions air-filled films, including in combination with titanium dioxide (EP-A 186902). The complicated manufacture of these films is described by Mathews et al. in U.S. Pat. No. 3,944,699. It takes the form of extrusion of a mixture of polyester and polyethylene or polypropylene with subsequent biaxial drawing and tempering. The polymers have to be mixed in the granulated state prior to extrusion. The coextrusion of the melts does not result in air-filled films. Mathews et al. describe the use of the films thus manufactured as substrates for photographic purposes. There is no mention of an influence on optical dot gain when used as a substrate for halftone images. Apart from their complicated manufacture, the disadvantage of these films is that there is no similarity with printing paper.

The present invention describes a process using as the image-receiving material for a colour-proofing image a support consisting of film or paper coated with a light-sensitive layer in which gas bubbles form on irradiation. The photolytically produced gas remains in the layer and gives it an opaque appearance on heating. The heating necessary to develop the gas bubbles can preferably also take place simultaneously with the lamination of the 1st primary colour image. The order of the primary colour images is freely choosable. Materials according to the invention, known as vesicular film, are described for example in EP 038016. If the vesicular layer is applied to a paper support, the colour-proofing image obtained is particularly similar to the print outcome to be simulated.

The preferred embodiment of the process of the invention comprises first preparing a layer material consisting of a temporary support (1) and a vesicular layer (2). The temporary support (1) preferably consists of polymer or polymer-coated specialty paper. The composition of vesicular layer (2) is described for example in EP-B 038016, FR-A 2 304 944, U.S. Pat. No. 3,622,336 and DE-A 2 438 157. It preferably includes a binder having a glass transition temperature of max. 130° C., so that the development temperature is max. 150° C.

Such preferred binders include for example copolymers of methacrylo-nitrile and vinylidene chloride. The light-sensitive compounds used for the vesicular layer (2) are preferably diazonium compounds which evolve nitrogen on irradiation. In this connection, particular preference is given to diazonium salts which form a vesicular layer on exposure and development. However, it is also possible to use any other compound which forms a gas by photolysis.

The vesicular layer (2) on the temporary support (1) is uniformly exposed to UV light until the light-sensitive compound has completely decomposed. When diazonium compounds are used, the decomposition is evidenced by the disappearance of the yellow colouring. When Ga-doped UV light sources having a power of 5 kW are used together with diazonium salts, for example, just a few seconds (20 s) are sufficient for complete decomposition. Longer exposure times are uncritical.

The exposed vesicular layer (2) has laminated onto it a colour-proofing film (F) under heat and pressure. The colour-proofing films preferred for the process of the invention consist of a temporary support (3), a light-sensitive colour layer (4) and an adhesive layer (5). Such materials are described for example in EP-A 352 055, U.S. Pat. No. 4,895,787, U.S. Pat. No. 5,049,476 and EP-A 525 624. The colour-proofing film is laminated onto the vesicular layer (2) with the adhesive layer (5). The lamination temperature is preferably sufficiently high for the vesicular layer to be thermally developed in the course of this lamination process and at the same time for the adhesive layer (5) to soften, to form a composite of colour-proofing film and vesicular layer. Typically the lamination temperature is 120° C. This method is preferred since it does not require an additional operation to develop the vesicular layer. However, the vesicular layer can also be thermally developed in some other way, for example in an oven, before the lamination of the first colour-proofing film. The light-sensitive layer (4) of the colour-proofing film is subjected to imagewise exposure through the support film (3) underneath a colour separation film before or preferably after lamination and developed after lamination onto the vesicular layer (2). This development must not attack the vesicular layer, which is why particular preference is given to dry-developable, peel-apart colour-proofing materials, which are developed by peeling off the temporary support film (3) after exposure. The colour-proofing materials described in EP-A-352 055, U.S. Pat. No. 5,049,476 and EP-A 525 624 are developed in this way.

After the development of the first primary colour image, the lamination, exposure and development of the second primary colour image but also of the subsequent primary colour images takes place until a complete colour-proofing image is obtained on the vesicular layer (2). This colour-proofing image has the advantage of lower dot gain over a colour-proofing image produced directly on a polymer-coated paper as support (1).

EXAMPLES

The examples which follow illustrate the invention. The dot gain ($S_2-S_1$) is calculated using test films having calibrated degrees of coverage ($S_1$) as exposure mask, according to the equation of Murray-Davies:

$$S_2 - S_1 = 100\left[\frac{1-10-D_s}{1-10-D_v}\right]$$

$S_2$: coverage of halftone field in proof
$S_1$: coverage of halftone field in film original
$D_S$: colour density in halftone field
$D_V$: colour density in full tone
The densities $D_s$ and $D_v$ are measured with a densitometer.

Example 1: Preparation of a vesicular film
A solution having the following composition is cast onto a biaxially oriented, 150 μm thick film of polyethylene

| Constituents | Parts by weight |
|---|---|
| Copolymer of methacrylonitrile and vinylidene chloride (comonomer ratio 70:30) | 12.8 |
| Copolymer of methacrylonitrile and vinylidene chloride (comonomer ratio 20:80; Saran ® F310, Dow Chemical) | 3.2 |
| 4-Morpholino-2,5-diisopropoxybenzene-diazonium tetrafluoroborate | 0.8 |
| Silicone oil (as flow-control agent) | 0.05 |
| 2-Butanone | 80.0 |

The layer is dried initially at 70° C. for 60 s and then at 130° C. for 30 s. The weight of the dried layer is 8 g/m². The film obtained has a yellow colour.

Example 2: Preparation of colour-proofing films for producing a colour-proofing image according to the invention Four light-sensitive colour-proofing films are prepared in the process colours of multicolour printing (cyan, magenta, yellow and black) by first applying coating solutions of the following compositions in each case to a 50 μm thick, biaxially oriented, heat-set and adhesion-promoted polyethylene terephthalate film and drying. The drying takes place at 70° C. for 2 min. The layer weights are 0.4–0.8 g/m²; they are selected so that the densities of a standard multicolour print are later achieved in the ready-produced colour-proofing image.

| | Constituents | Parts by weight | | | |
|---|---|---|---|---|---|
| | | Cyan | Magenta | Yellow | Black |
| 1. | Hostaperm Blue ®B2G (C.I. 74160) | 7 | | | |
| 2. | Permanent Yellow GR (C.I. 21100) | | | 7 | |
| 3. | Permanent Carmine FBB (C.I. 12485) | | 12 | | |
| 4. | Carbon Black (Printex ® 25) | | | | 11 |
| 5. | Polyvinyl formal (Formvar ® 12/85, Monsanto) | 6 | 18 | 13 | 9 |
| 6. | 2,3-Bis(4-methoxy-phenyl)quinoxaline | 4 | 4 | 4 | 4 |
| 7. | Dipentaerythritol pentaacrylate | 8 | 8 | 12 | 12 |
| 8. | γ-Butyrolactone | 44 | 89 | 65 | 90 |
| 9. | Tetrahydrofuran | 200 | 200 | 200 | 200 |
| 10. | 1-Methoxy-2-propanol | 444 | 489 | 465 | 490 |

Pigments 1.–4. are ball-milled with part of the binder (5.) and of the solvent (8.) before their addition to the respective solution.

An adhesive solution of the following composition is applied to the dried, light-sensitive colour layers and dried at 100° C. for 2 min. The dry adhesive layers each have a weight of 7 g/m².

| Constituents | Parts by weight |
| --- | --- |
| Copolymer of vinyl acetate and crotonic acid (comonomer ratio 95:5; Mowilith ®CT5, Hoechst AG) | 50.0 |
| Polyvinyl methyl ether (Lutanol ® M40, BASF) | 1.0 |
| Water | 253.3 |
| Ethanol | 24.0 |
| Ammonia solution (25% strength) | 5.0 |

Example 3: Preparation of a colour-proofing image on a vesicular film

The vesicular film of Example 1 is exposed for 20 s in a contact copying frame (5 kW, Ga-doped burner). After exposure, the film no longer shows the typical intensive yellow colouring, but is still transparent. The cyan film of Example 2 is laminated with the adhesive-layer side onto the layer side of the exposed vesicular film at 120° C. and under pressure. The vesicular film becomes opaquely white as a result. The cyan film of the laminate is subjected to image-wise exposure under a colour separation film (60 lines per cm screen) through its 50 µm thick support film. The exposure time is chosen so that the tonal value range is 3–98%. After exposure, this support film is peeled off the colour-proofing film. The unexposed areas with the entire adhesive layer remain on the vesicular layer, while the exposed areas of the colour layer are peeled off together with the support film. The steps of lamination of the colour-proofing film exposure under the respective colour separation film and peeling the support film off the colour-proofing film are repeated for the colours magenta, yellow and black. To conclude, a matte or bright protective layer can be applied.

The colour densities are measured with a commercially available incident light densitometer (D186 from Gretag). A plurality of layers of white paper are used as measuring background. The colour densities can be used to calculate the dot gain according to the equation of Murray-Davies (see page 6). The tonal value range is checked visually using an eye glass. The results are shown in Table 1.

TABLE 1

| Coverage Film ($S_1$) | Dot gain cyan | Dot gain magenta | Dot gain yellow | Dot gain black |
| --- | --- | --- | --- | --- |
| 40% | 19 | 21 | 17 | 21 |
| 80% | 10 | 13 | 11 | 12 |

Example 4 (Comparative example): Colour-proofing image on a support material without vesicular layer The colour-proofing films of Example 2 are laminated in succession in the same order as in Example 3 onto a polymer-coated specialty paper (Ozasol® TF01) instead of onto a vesicular film, exposed and developed. Exposure is carried out in such a way that the tonal value range of every colour is identical in Example 3 and Example 4; only then are the dot gains comparable. Again the dot gains of the primary colours are determined in the ready-produced colour-proofing image. The results are shown in Table 2:

TABLE 2

| Coverage Film ($S_1$) | Dot gain cyan | Dot gain magenta | Dot gain yellow | Dot gain black |
| --- | --- | --- | --- | --- |
| 40% | 22 | 24 | 22 | 24 |
| 80% | 12 | 14 | 12 | 13 |

The comparison with the values of Table 1 shows a reduction in dot gain in Example 3 by 3–5% at a coverage of 40% and by 1–2% at a coverage of 80% in the film original.

Example 5: Preparation of a paper support with vesicular layer

A solution of the following composition is applied to the polymer-coated specialty paper of Example 4 (Ozasol® TF01) and dried. Drying is 1 min at 70° C. The layer weight is about 10 g/m².

| Constituents | Parts by weight |
| --- | --- |
| Copolymer of methacrylonitrile and vinylidene chloride (comonomer ratio 70:30) | 18.4 |
| Copolymer of methacrylonitrile and vinylidene chloride (comonomer ratio 20:80; Saran ® F310, Dow Chemical) | 0.8 |
| 3-Chloro-4-N,N'-dimethylaminobenzene-diazonium hexafluorophosphate | 0.76 |
| Silicone oil (as flow-control agent) | 0.03 |
| Citric acid | 0.13 |
| 2-Butanone | 20.0 |

The support obtained has a yellow colour on the vesicular layer side. After exposure, which is carried out in the manner described in Example 3, the yellow colouring disappears. This support can either be used directly for preparing a colour-proofing image or else be first provided with an additional adhesive layer to ensure better adhesion of the image. To this end, a layer of the following composition is applied to a further temporary support film consisting of biaxially oriented and heat-set polyethylene terephthalate without adhesion promotion and dried. The weight of the dried layer is 20 g/m².

| Constituents | Parts by weight |
| --- | --- |
| Polyvinyl acetate (Mowilith ® 30, Hoechst) | 25 |
| 2-Butanone | 75 |

This adhesive-layer film is laminated with the layer side face down onto the specialty paper coated with the exposed vesicular layer. The support film of the adhesive-layer film is peeled off; the additional adhesive layer remains on the vesicular layer, which was thermally developed at the same time as the lamination of the additional adhesive-layer film.

Example 6: Preparation of a colour-proofing image on a paper support with vesicular layer A colour-proofing image is prepared on the specialty paper of Example 5, provided with an exposed vesicular layer and additional adhesive layer, analogously to Examples 3 and 4 by lamination, exposure and peeling off of the four colour-proofing films, and the dot gain is measured in the ready-produced proof. The values obtained are compared with those obtained in the case of a proof on TF01 without vesicular layer but (for reasons of comparability) with the additional adhesive layer of Example 5. The results are shown in Table 3.

TABLE 3

| Support | Coverage Film (S₁) | Dot gain cyan | Dot gain magenta | Dot gain yellow | Dot gain black |
| --- | --- | --- | --- | --- | --- |
| TF01 + vesicular + adhesive layer | 40% | 20 | 17 | 19 | 27 |
| TF01 + vesicular + adhesive layer | 80% | 11 | 12 | 12 | 14 |
| TF01 + adhesive layer | 40% | 26 | 24 | 23 | 28 |
| TF01 + adhesive layer | 80% | 12 | 13 | 12 | 14 |

The comparison of the values shows a reduction in the dot gain due to the vesicular layer by 1–7% at a coverage of 40% and by 0–1% at a coverage of 80% in the film original. The effect is distinctly less with the fourth primary colour image (black) than with the first two primary colour images (cyan and magenta). The additional adhesive layer distinctly increases the dot gains in comparison with Example 4 without the action of the vesicular layer. The dot gain increase due to additional adhesive layers is known (see page 1 et seq.). With a vesicular layer it is thus possible to utilize the advantages of an additional adhesive layer (for example reduction in dust inclusions during lamination) without the simultaneous disadvantage of a dot gain increase. By using a polymer-coated paper as support, the proof obtained in this example is more similar to the final print result than a colour-proofing image obtained according to Example 3 on a vesicular film.

What is claimed is:

1. A process for producing a colored image comprising laminating a light-sensitive material comprising a temporary support film (i), a colored light-sensitive layer and a heat-activable adhesive layer onto an image-receiving material at elevated temperature and under pressure, subjecting the light-sensitive layer to imagewise exposure and developing the imagewise-exposed layer to the image, and optionally repeating these steps with at least one further light-sensitive film in another color, wherein the image-receiving material comprises on a support material (ii) at least one light-sensitive vesicular layer which has been exposed by actinic radiation prior to said first lamination step, thereby producing a gas by photolysis, wherein the gas remains in the light sensitive vesicular layer and gives the layer an opaque appearance upon heating.

2. A process according to claim 1, wherein the light-sensitive layer of the image-receiving material comprises a diazonium salt.

3. A process according to claim 2, wherein the diazonium salt is a halogen-containing diazonium hexafluorophosphate.

4. A process according to claim 3, wherein the halogen-containing diazonium hexafluorophosphate is 3-chloro-4-N,N'-dimethylaminobenzenediazonium hexafluorophosphate.

5. A process according to claim 1, wherein the support material (ii) of the image-receiving material is at least partly made of paper.

6. A process according to claim 5, wherein the support material (ii) of the image-receiving material is a polymer-coated paper support.

7. A process according to claim 1, wherein a further, heat-activable adhesive layer is disposed between the vesicular layer of the image-receiving material and the thermally activable adhesive layer of the light-sensitive color film.

8. A process according to claim 1, wherein the colored image is developed by peeling the support film (i) and the image-receiving sheet apart.

* * * * *